(12) United States Patent
Sakamoto et al.

(10) Patent No.: US 9,586,343 B2
(45) Date of Patent: Mar. 7, 2017

(54) METHOD FOR PRODUCING NANOIMPRINT MOLD

(71) Applicant: DAI NIPPON PRINTING CO., LTD., Tokyo (JP)

(72) Inventors: Takeshi Sakamoto, Tokyo (JP); Yusuke Kawano, Tokyo (JP); Mikio Ishikawa, Tokyo (JP); Yoichi Hitomi, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 13 days.

(21) Appl. No.: 14/436,627

(22) PCT Filed: Nov. 29, 2013

(86) PCT No.: PCT/JP2013/082129
§ 371 (c)(1),
(2) Date: Apr. 17, 2015

(87) PCT Pub. No.: WO2014/103615
PCT Pub. Date: Jul. 3, 2014

(65) Prior Publication Data
US 2016/0167256 A1   Jun. 16, 2016

(30) Foreign Application Priority Data
Dec. 28, 2012 (JP) ................. 2012-286691

(51) Int. Cl.
*B29C 33/38* (2006.01)
*G03F 7/00* (2006.01)
(Continued)

(52) U.S. Cl.
CPC .......... *B29C 33/3842* (2013.01); *B29C 33/38* (2013.01); *G03F 7/0002* (2013.01);
(Continued)

(58) Field of Classification Search
CPC ... B29C 33/3842; B29C 33/38; G03F 7/0002; C09K 13/00; C23C 16/45525;
(Continued)

(56) References Cited

U.S. PATENT DOCUMENTS 5,772,905 A    6/1998  Chou
8,623,770 B1 *  1/2014  Gao ................. H01L 21/02186
                                                 257/E21.236
(Continued)

FOREIGN PATENT DOCUMENTS

JP    2007-268831 A    10/2007
JP    2008-536297 A     9/2008
(Continued)

OTHER PUBLICATIONS

Aug. 20, 2014 Office Action issued in Japanese Application No. 2014-532185.
(Continued)

*Primary Examiner* — Anita Alanko
(74) *Attorney, Agent, or Firm* — Oliff PLC

(57) ABSTRACT

In the method, a sidewall pattern is formed in a side wall of a first resist pattern that is formed on a second hard mask layer of a base material in which first and second hard mask layers are laminated in the order of description, a second hard mask pattern is formed by etching the second hard mask layer by using the sidewall pattern as a mask, a first hard mask pattern is formed by etching the first hard mask layer by using, as a mask, the second hard mask pattern and a second resist pattern that is formed on the first hard mask layer of the base material, and the first and second fine patterns are formed by etching the base material by using the first hard mask pattern as a mask.

20 Claims, 9 Drawing Sheets

(51) Int. Cl.
*C23C 16/455* (2006.01)
*B81C 1/00* (2006.01)
*B82Y 40/00* (2011.01)
*C09K 13/00* (2006.01)

(52) U.S. Cl.
CPC .... *B29K 2995/0026* (2013.01); *B81C 1/0092* (2013.01); *B81C 1/00396* (2013.01); *B81C 1/00404* (2013.01); *B82Y 40/00* (2013.01); *C09K 13/00* (2013.01); *C23C 16/45525* (2013.01)

(58) Field of Classification Search
CPC ............ B81C 1/00404; B81C 1/00396; B81C 1/0092; B82Y 40/00; B29K 2995/0026
See application file for complete search history.

(56) References Cited

U.S. PATENT DOCUMENTS

| | | | |
|---|---|---|---|
| 2006/0211260 A1 | 9/2006 | Tran et al. | |
| 2007/0261016 A1* | 11/2007 | Sandhu | B82Y 10/00 716/50 |
| 2007/0281219 A1* | 12/2007 | Sandhu | B82Y 10/00 430/5 |
| 2008/0070165 A1 | 3/2008 | Fischer et al. | |
| 2008/0280217 A1* | 11/2008 | Liu | G03F 1/14 430/5 |
| 2008/0286449 A1* | 11/2008 | Park | B82Y 10/00 427/123 |
| 2008/0292976 A1 | 11/2008 | Terasaki et al. | |
| 2009/0170325 A1 | 7/2009 | Jung | |
| 2010/0055914 A1 | 3/2010 | Min et al. | |
| 2010/0130019 A1 | 5/2010 | Ohuchi | |
| 2010/0248482 A1 | 9/2010 | Hashimoto | |
| 2012/0205750 A1 | 8/2012 | Sudo | |
| 2013/0023120 A1 | 1/2013 | Yaegashi et al. | |

FOREIGN PATENT DOCUMENTS

| | | |
|---|---|---|
| JP | 2008-290316 A | 12/2008 |
| JP | 2009-164546 A | 7/2009 |
| JP | 2010-045359 A | 2/2010 |
| JP | 2010-503995 A | 2/2010 |
| JP | 2010-080942 A | 4/2010 |
| JP | 2011-216817 A | 10/2011 |
| JP | 4825891 B2 | 11/2011 |
| JP | 2012-169426 A | 9/2012 |

OTHER PUBLICATIONS

Feb. 4, 2014 International Search Report issued in International Application No. PCT/JP2013/082129.

* cited by examiner

METHOD FOR PRODUCING NANOIMPRINT MOLD

TECHNICAL FIELD

The present disclosure relates to a method for producing a nanoimprint mold.

BACKGROUND

The nanoimprinting technique, which is a fine processing technique, is a technique for forming a pattern by using a mold member (imprint mold) in which a fine uneven pattern is formed on the surface of a base material, and transferring the fine uneven pattern onto a workpiece such as an imprint resin to thereby same-size transfer the fine uneven pattern (see Patent Document 1). In particular, the nanoimprint technique has been increasingly attracting attention in the field of semiconductor device fabrication processes as the miniaturization of wiring patterns or the like in semiconductor devices have been further progressing.

In the imprint molds used in such nanoimprint technique, a fine uneven pattern (main pattern) for fabricating, for example, a wiring pattern in a semiconductor device is formed on a pattern formation surface. Then, a fine uneven pattern (dummy pattern, alignment mark, etc.) of a size larger than that of the main pattern is typically also formed on the pattern formation surface with the object of facilitating the release of the imprint mold and aligning the imprint mold with the transfer substrate such as a semiconductor substrate during the imprint processing. Along with the progress in the miniaturization of semiconductor devices produced by nanoimprinting using such imprint molds, the size of the main pattern in the imprint molds has been reduced to less than several tens of nanometers.

With the subsequent progress in miniaturization of semiconductor devices, the technological development advances in the direction of further reducing the size of the main pattern in the imprint molds, and a method for processing a base material for an imprint mold by using a sidewall pattern formed by the so-called sidewall process has been suggested as a method for producing an imprint mold in which a fine-size main pattern and a dummy pattern or an alignment mark which is larger in size than the main pattern are formed in the pattern formation surface (see Patent Document 2).

RELATED ART LIST

Patent Documents

Patent Document 1: U.S. Pat. No. 5,772,905
Patent Document 2: Japanese Patent No. 4825891

SUMMARY

Problems to be Solved

In the method for producing an imprint mold disclosed in Patent Document 2, initially, a hard mask layer (a metallic chromium film, or the like) and a core layer (a silicon oxide film, or the like) are laminated in the order of description on a base material (quartz substrate, or the like) for an imprint mold, and then a first resist pattern for forming a core material of a sidewall pattern is formed on the core layer.

Then, the core layer is etched using the first resist pattern as a mask, thereby forming a core layer pattern, the core material is formed by slimming the core layer pattern, and the sidewall pattern is formed on a side wall of the core material.

Subsequently, a second resist pattern is formed such as to leave the core material positioned in a region (region for forming a dummy pattern or an alignment mark) outside the region for forming a fine-size main pattern, and only the core material in the region for forming the fine-size main pattern is removed by etching. As a result, the sidewall pattern from which the core material has been removed remains in the region for forming the fine-size main pattern, and a sidewall pattern from which the core material has not been removed remains in the region for forming the dummy pattern or alignment mark which is larger in size than the main pattern.

A hard mask layer is then etched by using the sidewall pattern from which the core material has been removed and the sidewall pattern from which the core material has not been removed as a mask, and the base material for an imprint mold is etched using the hard mask pattern thus formed as a mask. As a result, it is possible to produce an imprint mold having a fine uneven pattern (main pattern) of a fine size and a fine uneven pattern (dummy pattern, alignment mask, or the like) which is larger in size than the aforementioned fine uneven pattern (main pattern).

Where the hard mask layer is etched by using as a mask the sidewall pattern formed by the so-called sidewall process, as in the method for producing an imprint mold disclosed in the above-described Patent Document 2, the size of the hard mask pattern formed by the etching depends on the size of the sidewall pattern. The size of the sidewall pattern also depends on the thickness of a film formed by a CVD method or a sputtering method, such as a silicon oxide film or silicon nitride film, constituting the sidewall pattern. Thus, the size controllability is extremely high. Specifically, an imprint mold having a fine uneven pattern (main pattern) faithful to the designed size can be produced by matching the thickness of the film such as a silicon oxide film and silicon nitride film constituting the sidewall pattern with the designed size of the fine uneven pattern (main pattern) in the imprint mold.

Meanwhile, with the method disclosed in Patent Document 2, part of the core material where the sidewall pattern has been formed is left and the core material and the sidewall pattern are used as a mask pattern when the hard mask layer is etched in order to form the main pattern and also a fine uneven pattern (dummy pattern, alignment mark, or the like) which is larger in size than the main pattern in the same pattern formation surface. In order to leave part of the core material, the second resist pattern is formed that covers both the core material and the sidewall pattern. As a result, the patterns of different size (the sidewall pattern form which the core material has been removed and the sidewall pattern from which the core material has not been removed), which are used as a mask when the hard mask layer is etched, are formed in the same pattern formation surface and fine uneven patterns of different sizes are formed in the same pattern formation surface.

However, since the size of the sidewall pattern and core material is extremely small, surface tension created by a development liquid or rinsing liquid acts upon the sidewall pattern in a series of steps of a wet process including, for example, a development step, a rinsing step, and a drying step for removing the uncured resist film in the lithographic process implemented when the second resist pattern is formed. As a result, the sidewall pattern which has not been covered by the second resist pattern can be tilted or damaged.

Further, the metallic chromium film constituting the hard mask layer and the silicon oxide film constituting the core material or the sidewall pattern do not have strong bonds formed at the interfaces thereof. In particular, as a result of the core material or sidewall pattern having a large aspect ratio, the core material or sidewall pattern can be peeled off or deformed in the wet process.

The resultant problem is that where the sidewall pattern is thus tilted, broken, peeled off, or deformed, a small-size fine uneven pattern (main pattern) cannot be formed and the production yield of the imprint molds decreases.

With the foregoing in view, it is an objective of the present disclosure to provide a high-yield method for producing by the so-called sidewall process an imprint mold in which fine uneven patterns of different size are formed in the same surface (pattern formation surface).

Means of Solving the Problems

In order to resolve the abovementioned problem, the present disclosure provides a method for producing a nanoimprint mold in which a first fine pattern and a second fine pattern which is larger in size than the first fine pattern are formed on the same surface, the method including: a first resist pattern formation step for preparing a base material in which a first hard mask layer and a second hard mask layer are laminated in the order of description, and forming a first resist pattern on the second hard mask layer positioned in an upper layer of a first pattern region where the first fine pattern is to be formed in the base material; a sidewall pattern formation step for forming a sidewall pattern in a side wall of the first resist pattern; a second hard mask pattern formation step for etching the second hard mask layer by using the sidewall pattern as a mask, and forming a second hard mask pattern; a second resist pattern formation step for forming a second resist pattern on the first hard mask layer positioned in an upper layer of a second pattern region where the second fine pattern is to be formed in the base material; a first hard mask pattern formation step for etching the first hard mask layer by using the second hard mask pattern and the second resist pattern as a mask, and forming a first hard mask pattern; and a fine pattern formation step for etching the base material by using the first hard mask pattern as a mask, and forming the first fine pattern and the second fine pattern (embodiment 1).

The present disclosure also provides a method for producing a nanoimprint mold in which a first fine pattern and a second fine pattern which is larger in size than the first fine pattern are formed on the same surface, the method including: a second resist pattern formation step for preparing a base material in which a first hard mask layer and a second hard mask layer are laminated in the order of description, and forming a second resist pattern on the second hard mask layer positioned in an upper layer of a second pattern region where the second fine pattern is to be formed in the base material; a second hard mask pattern formation step for etching the second hard mask layer by using the second resist pattern as a mask, and forming a second hard mask pattern; a first resist pattern formation step for forming a first resist pattern on the second hard mask pattern and on the first hard mask layer positioned in an upper layer of a first pattern region where the first fine pattern is to be formed in the base material; a sidewall pattern formation step for forming a sidewall pattern in a side wall of the first resist pattern; a first hard mask pattern formation step for etching the first hard mask layer by using the sidewall pattern and the second hard mask pattern as a mask, and forming a first hard mask pattern; and a fine pattern formation step for etching the base material by using the first hard mask pattern as a mask, and forming the first fine pattern and the second fine pattern (embodiment 2).

The present disclosure also provides a method for producing a nanoimprint mold in which a first fine pattern and a second fine pattern which is larger in size than the first fine pattern are formed on the same surface, the method including: a second resist pattern formation step for preparing a base material in which a first hard mask layer and a second hard mask layer are laminated in the order of description, and forming a second resist pattern on the second hard mask layer positioned in an upper layer of a second pattern region where the second fine pattern is to be formed in the base material; a second hard mask pattern formation step for etching the second hard mask layer by using the second resist pattern as a mask, and forming a second hard mask pattern; a first resist pattern formation step for forming a first resist pattern on the first hard mask layer positioned in an upper layer of a first pattern region where the first fine pattern is to be formed in the base material, and not forming the first resist pattern on the second hard mask pattern; a sidewall pattern formation step for forming a sidewall pattern in a side wall of the first resist pattern and in a side wall of the second hard mask pattern; a first hard mask pattern formation step for etching the first hard mask layer by using the sidewall pattern and the second hard mask pattern as a mask, and forming a first hard mask pattern; and a fine pattern formation step for etching the base material by using the first hard mask pattern as a mask, and forming the first fine pattern and the second fine pattern (embodiment 3).

In the abovementioned embodiments (embodiments 1 to 3), it is preferred that the first hard mask layer be constituted by a metal material, and the second hard mask layer be constituted by silicon or silicon oxide, nitride, or oxynitride (embodiment 4).

Advantageous Effect

In accordance with the present disclosure, it is possible to provide a high-yield method for producing by the so-called sidewall process an imprint mold in which fine uneven patterns of different size are formed in the same surface (pattern formation surface).

EMBODIMENTS

The embodiments of the present disclosure will be explained hereinbelow with reference to the drawings.

Figure 1:
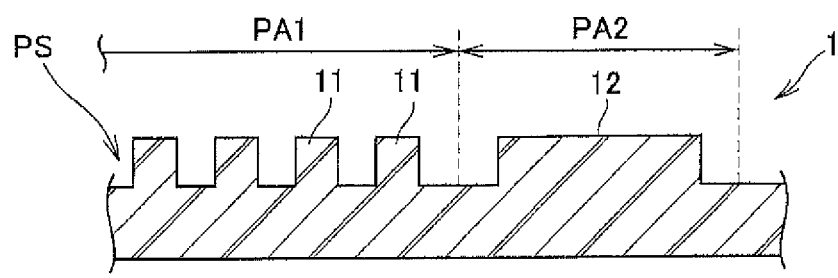
FIG. 1 is a cross-sectional view illustrating the schematic configuration example of an imprint mold produced in an embodiment of the present disclosure.

FIG. 1 is a cross-sectional view illustrating the schematic configuration example of an imprint mold produced in an embodiment of the present disclosure.

As shown in FIG. 1, an imprint mold 1 in the first embodiment has a fine uneven pattern (main pattern; can be also referred to hereinbelow as "small pattern") 11 for producing a wiring pattern or the like in a semiconductor device and a fine uneven pattern (dummy pattern, alignment mark pattern, or the like; can be also referred to hereinbelow as "large pattern") 12 which is larger in size than the fine uneven pattern (main pattern) 11. At least the fine uneven pattern 11 is of a line-and-space shape.

The two fine uneven patterns 11, 12 are formed in a first pattern region PA1 and a second pattern region PA2, respectively, in a pattern formation surface PS of the imprint mold 1. Thus, the two fine uneven patterns 11, 12 are formed in the same surface.

The size of the small pattern 11 is, for example, about 5 nm to 30 nm which is the size (size less than a lithography resolution limit (limit exposure line width)) at which a resist pattern is difficult or impossible to form by the typical lithography (electron beam lithography, UV lithography, etc.). Meanwhile, the size of the large pattern 12 is, for example, about 50 nm to 300 nm which is the size at which a resist pattern can be formed by the typical lithography.

A method for producing the imprint mold 1 having such a configuration will be described below in detail.

First Embodiment

FIGS. 2A to 2J are a flow chart illustrating in a cross-sectional view the steps of the method for producing the imprint mold in the first embodiment.

Figure 2A:
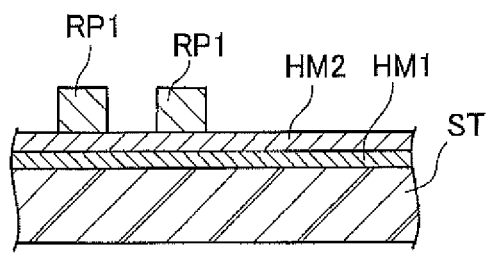
FIGS. 2A to 2J are a flow chart illustrating in a cross-sectional view the steps of the method for producing an imprint mold in the first embodiment of the present disclosure.

As shown in FIGS. 2A to 2J, in the method for producing the imprint mold in the first embodiment, initially, an imprint mold base material ST is prepared in which a first hard mask layer HM1 and a second hard mask layer HM2 are laminated in the order of description, and a first resist pattern RP1 is formed on the second hard mask layer HM2 positioned in the upper layer of the first pattern region (region where the small pattern 11 is to be formed) PA1 in the imprint mold 1 (first resist pattern formation step; FIG. 2A).

The imprint mold base material ST can be selected, as appropriate, according to the application (application such as for optical imprinting, thermal imprinting, or the like) of the imprint mold 1, and substrates (for example, a transparent substrate such as a glass substrate such as quarts glass, soda glass, fluorite, a calcium fluoride substrate, a magnesium fluoride substrate, and acrylic glass, a resin substrate such as a polycarbonate substrate, a polypropylene substrate, and a polyethylene substrate, and a laminated substrate obtained by laminating any two or more substrates selected from the aforementioned substrates; a metal substrate such as a nickel substrate, a titanium substrate, and an aluminum substrate; and a semiconductor substrate such as a silicon substrate and a gallium nitride substrate) that are usually used in production of imprint molds can be used. The thickness of the imprint mold base material ST can be set, as appropriate, for example, within a range from 300 μm to about 10 mm with consideration for strength and handleability of the substrate. The term "transparent" in the first embodiment means that the transmittance of light rays with a wavelength of 300 nm to 450 nm is equal to or greater than 85%, preferably equal to or greater than 90%, more preferably equal to or greater than 95%.

For example, a metal such as chromium, titanium, tantalum, silicon, and aluminum; a chromium-containing compound such as chromium nitride, chromium oxide, and chromium oxynitride; a tantalum compound such as tantalum oxide, tantalum oxynitride, tantalum oxyboride, and tantalum oxide nitride boride, titanium nitride, silicon nitride, and silicon oxynitride can be used individually or in randomly selected combinations of two or more thereof as a material for constituting the first hard mask layer HM1.

Since the first hard mask layer HM1 can be used as a mask the imprint mold base material ST is etched after patterning in the below-described first hard mask pattern formation step (FIG. 2I), a material therefor is preferably selected with consideration for the etching selection ratio corresponding to the type of the imprint mold base material ST. For example, where the imprint mold base material ST is quartz glass, a metallic chromium film can be advantageously selected as the first hard mask layer HM1.

The thickness of the first hard mask layer HM1 is set, as appropriate, with consideration for the etching selection ratio corresponding to the type of the imprint mold base material ST and the height (depth) of the small pattern 11 and the large pattern 12 in the imprint mold 1. For example, when the imprint mold base material ST is quartz glass and the first hard mask layer HM1 is a metallic chromium film, the thickness of the first hard mask layer HM1 is about 3 nm to 10 nm.

For example, silicon or a silicon-containing material such as silicon nitride, silicon oxide, and silicon oxynitride can be used as a material constituting the second hard mask layer HM2. Since the second hard mask layer HM2 is used as a mask when the first hard mask layer HM1 is etched, the material constituting the second hard mask layer HM2 is preferably selected with consideration for the etching selection ratio corresponding to the material constituting the first hard mask layer HM1. For example, where the first hard mask layer HM1 is a metallic chromium film, a silicon oxide film, a silicon nitride film, and a silicon oxynitride film can be advantageously selected as the second hard mask layer HM2.

Since the second hard mask pattern HP2 formed by etching the second hard mask layer HM2 is used as the etching mask of the first hard mask layer HM1, the thickness of the second hard mask layer HM2 is set, as appropriate, with consideration for the etching selection ratio corresponding to the material of the first hard mask layer HM1. For example, when chromium is used as a material constituting the first hard mask layer HM1 and a silicon-containing material is used as a material constituting the second hard mask layer HM2, the thickness of the second hard mask layer HM2 is about 2 nm to 20 nm.

For example, an electron-beam-sensitive resist material and an imprint resist material (UV-curable resin or the like) can be used as a resist material constituting the first resist pattern RP1. When an electron-beam-sensitive resist material is used as the resist material, the first resist pattern RP1 is formed by electron beam drawing a resist pattern image on the an electron-beam-sensitive resist film formed on the second hard mask layer HM2, and implementing a series of wet processes including developing, rinsing, and drying.

In the first embodiment, a negative-type resist is used as the electron-beam-sensitive resist material constituting the first resist pattern RP1, but a positive-type resist may be also used, provided it creates no problems from the standpoint of electron beam irradiation area or irradiation time (drawing time). The below-described core material formation step (step for slimming the first resist pattern RP1; see FIG. 2B) may be omitted, provided that the first resist pattern RP1 which is equal in size to the core material CP formed in the below-described core material formation step (see FIG. 2B) can be formed in the above-described first resist pattern formation step (FIG. 2A).

The size of the first resist pattern RP1 is not particularly limited and can be set to about two times the size of the small pattern 11 of the imprint mold 1. For example, where the size of the small pattern 11 of the imprint mold 1 is 15 nm, the size of the first resist pattern RP1 is about 30 nm.

Further, in the first resist pattern formation step (FIG. 2A), the resist pattern image may be formed by irradiation with UV radiation (UV, EUV, etc.) or laser radiation. In this case, a resist material (a UV-sensitive resist material, an EUV-sensitive resist material, a laser radiation-sensitive resist material, etc.) adequate to the type of the exposure light source (UV, EUV, laser, etc.) to be used can be used as the resist material constituting the first resist pattern RP1.

Further, in the first resist pattern formation step (FIG. 2A), the first resist pattern RP1 may be also formed by imprint processing using an imprint mold having a fine uneven pattern corresponding to the first resist pattern RP1. In this case, the fine uneven pattern of the imprint mold to be used in the imprint processing may be formed by a sidewall process using an ALD film or the like. As a result of forming the first resist pattern RP1 by the imprint processing using such an imprint mold, it is possible to reduce further the size of the small pattern 11 in the imprint mold 1 which is to be produced.

The first resist pattern RP1 fulfills a role as the core material CP for forming a sidewall pattern WP by the below-described sidewall pattern formation step (FIG. 2D), and since the sidewall pattern WP is formed in the side wall of the core material CP, the height (thickness) of the core material CP and the sidewall pattern WP after the sidewall pattern formation step (FIG. 2D) is substantially the same.

Figure 2D:
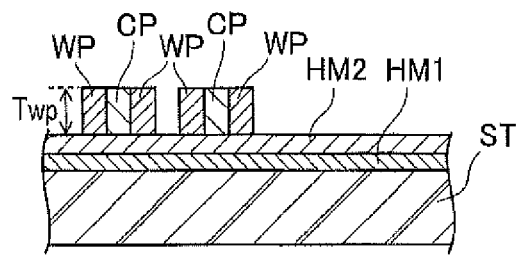
Figure 2B:
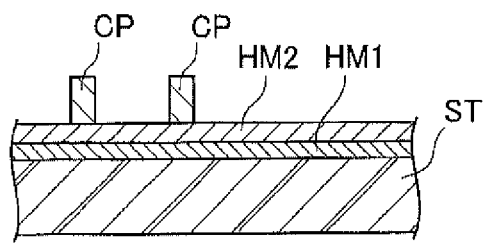
Figure 2E:
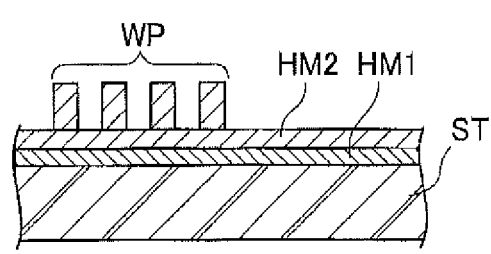
Figure 2C:
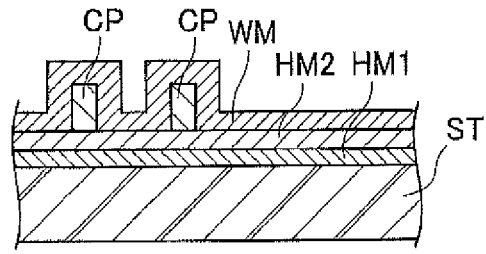
Figure 2F:
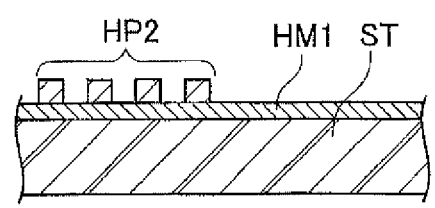
Figure 2G:
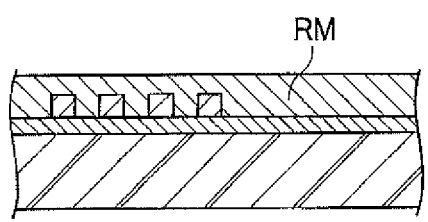

The sidewall pattern WP fulfills a role as an etching mask for etching the second hard mask layer HM2 in the below-described second hard mask pattern formation step (FIG. 2F). Therefore, the height (thickness) of the sidewall pattern WP is required to be the height (thickness) of an order such that the sidewall pattern WP does not disappear in the etching processing of the second hard mask layer HM2, the specific value of the height (thickness) depending on the etching selection ratio of the materials constituting the sidewall pattern WP and the second hard mask layer HM2.

Meanwhile, since the core material CP is formed by slimming the first resist pattern RP1 by subjecting this pattern to etching in the below-described core material formation step (FIG. 2B), the height (thickness) of the core material CP becomes lower (thinner) than the height (thickness) of the first resist pattern RP1. Therefore, the height (thickness) of the first resist pattern RP1 should be higher (thicker) than the height (thickness) required for the sidewall pattern WP with consideration for the slimming amount in the below-described core material formation step (FIG. 2B).

Then, the first resist pattern RP1 formed on the second hard mask layer HM2 is subjected to the slimming processing, and the core material CP with a slimmed first resist pattern RP1 is formed (core material formation step, FIG. 2B). The slimming processing of the first resist pattern RP1 can be implemented, for example, by a wet etching method, a dry etching method, or a combination thereof.

The slimming amount of the first resist pattern RP1 is not particularly limited, but since the space size (the length of the gap between the adjacent small patterns 11) in the small pattern 11 of the imprint mold 1 depends on the size of the core material CP formed by the slimming processing of the first resist pattern RP1, the slimming amount of the first resist pattern RP1 may be set according to the space size in the small pattern 11. The slimming amount is usually set such that the size of the core material CP becomes about half that of the first resist pattern RP1.

Then, a sidewall material film WM constituting the sidewall pattern WP is formed over the entire surface of the second hard mask layer HM2 including the core material CP (sidewall material film formation step, FIG. 2C), and the sidewall pattern WP is formed in the side wall of the core material CP by performing etch-back by anisotropic etching such as RIE (Reactive Ion Etching) (sidewall pattern formation step, FIG. 2D).

The sidewall material film WM can be formed by depositing the sidewall material which is a silicon-containing material (silicon oxide or the like) by a well-known conventional deposition method such as an ALD (Atomic layer deposition) method, a CVD method, or a sputtering method. Where a resist material is used as the material constituting the core material CP, as in the first embodiment the deposition can be conducted at a lower temperature, and it is desirable that the sidewall material film WM be formed by the ALD method that makes it possible to control the film thickness at an atomic layer level.

Since the size of the small pattern 11 in the imprint mold 1 depends on the thickness of the sidewall material film WM, the thickness of the sidewall material film WM can be set according to the designed size of the small pattern 11.

Since the sidewall pattern WP formed by etch-back is used as the etching mask for the second hard mask layer HM2, the height $T_{WP}$ (length in the thickness direction of the imprint mold base material ST) of the sidewall pattern WP is set, as appropriate, with consideration for the etching selection ratio corresponding to the second hard mask layer HM2. For example, where a silicon-containing material is used as a material constituting the sidewall pattern WP and the second hard mask layer HM2, the height $T_{WP}$ of the sidewall pattern WP is about 5 nm to 60 nm.

Then, the core material CP on the side wall of which the sidewall pattern WP has been formed is removed by ashing (for example, plasma ashing using an oxygen-containing gas) (core material removal step, FIG. 2E). As a result, only the core material CP is removed and the sidewall pattern WP is left on the second hard mask layer HM2.

Then, the second hard mask layer HM2 is etched by a dry etching method by using the sidewall pattern WP as a mask, and the second hard mask pattern HP2 is formed (second hard mask pattern formation step, FIG. 2F).

Figure 2H:
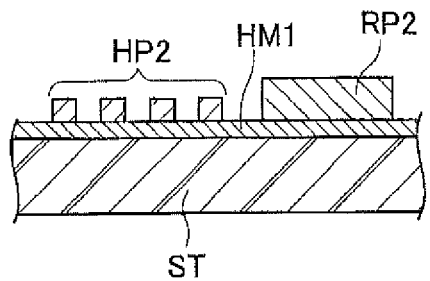

After the second hard mask pattern HP2 has been formed, a resist film RM is formed (FIG. 2G) on the first hard mask layer HM1 such as to cover also the second hard mask pattern HP2, and the second resist pattern RP2 is formed on the first hard mask layer HM1 positioned in the upper layer of the second pattern region (region PA2 where the large pattern 12 is to be formed) in the imprint mold 1 (second resist pattern formation step, FIG. 2H).

The size of the second resist pattern RP2 can be set according to the size of the large pattern 12 of the imprint mold 1.

A material (an electron beam-sensitive resist material, a UV-sensitive resist material, an EUV-sensitive resist material, a laser-sensitive resist material, or the like) same as that used for the first resist pattern RP1 can be used as a resist material constituting the second resist pattern RP2. A negative-type resist or a positive-type resist can be selected, as appropriate, according to the irradiation area or irradiation time (drawing time) of an electron beam or the like. A resist pattern image is formed in the resist film RM formed on the first hard mask layer HM1, and a series of processes including the development processing, rinsing processing, and drying processing is implemented to form the second resist pattern RP2.

Figure 2I:
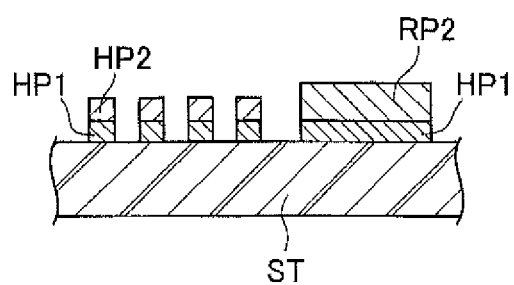

Then, the first hard mask layer HM1 is etched by dry etching by using the second hard mask pattern HP2 and the second resist pattern RP2 as a mask, and the first hard mask pattern HP1 is formed (first hard mask pattern formation step, FIG. 2I). The first hard mask pattern HP1 can thus be formed which is to be used as an etching mask for simultaneously forming fine uneven patterns (small pattern 11 and large pattern 12) of different size on the pattern formation surface PS of the imprint mold base material ST.

Figure 2J:
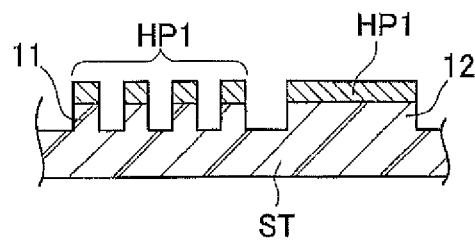

The imprint mold base material ST is then etched using the first hard mask pattern HP1 formed in the abovementioned manner as a mask, and the small pattern 11 and the large pattern 12 are simultaneously formed in the same surface of the imprint mold base material ST (fine uneven pattern formation step, FIG. 2J).

Finally, the first hard mask pattern HP1 is peeled off thereby producing the imprint mold 1 (see FIG. 1) in which the fine uneven pattern (main pattern) 11 for producing, for example, the wiring pattern of a semiconductor device and the fine uneven pattern (dummy pattern, alignment mark, etc.) 12 which is larger in size than the fine uneven pattern (main pattern) 11 are formed in the pattern formation surface PS.

Figure 3A:
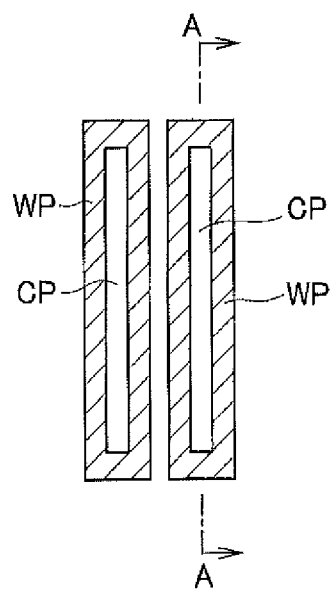
FIG. 3A is a plan view showing a closed-loop structure formed in the method for producing an imprint mold in the first and second embodiments of the present disclosure.
Figure 3B:
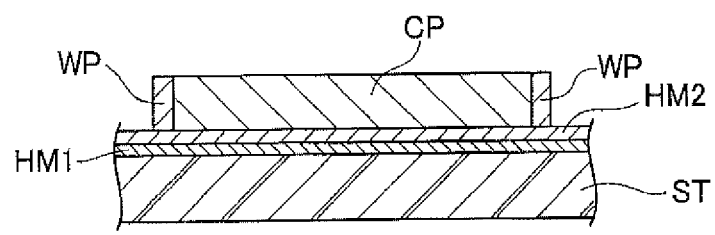
FIG. 3B is a sectional view taken along the A-A line in FIG. 3A.

Since the sidewall pattern WP formed in the abovementioned sidewall pattern formation step (FIG. 2D) is formed along the side wall of the core material CP, the sidewall pattern has the so-called closed loop structure, as shown in FIGS. 3A and 3B. FIG. 3A is a plan view showing the core material CP and the sidewall pattern WP formed by the sidewall pattern formation step illustrated by FIG. 2D. FIG. 3B is a sectional view taken along the A-A line in FIG. 3A. In FIG. 3A, the sidewall pattern WP is hatched to facilitate the understanding.

Where the production steps are implemented up to the fine uneven pattern formation step (FIG. 2J) in a state in which the closed loop structure of the sidewall pattern WP is maintained, the small pattern 11 formed in the produced imprint mold 1 also has the closed loop structure.

Therefore, it is preferred that the method for producing an imprint mold according to the first embodiment further include a closed loop removal step for removing the closed loop structure. As a result of including the closed loop removal step, it is possible to form the small pattern 11 having no closed loop structure.

The closed loop removal step can be implemented after any of the sidewall pattern formation step (FIG. 2D), core material removal step (FIG. 2E), second hard mask pattern formation step (FIG. 2F), and first hard mask pattern formation step (FIG. 2I).

Figure 4A:
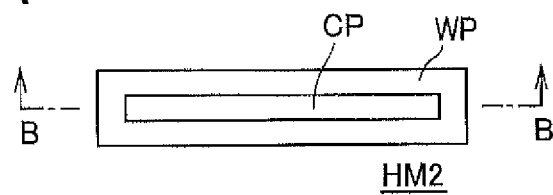
FIGS. 4A to 4D are a flow chart illustrating in a plan view a closed loop removal step in the first and second embodiments of the present disclosure.
Figure 4B:
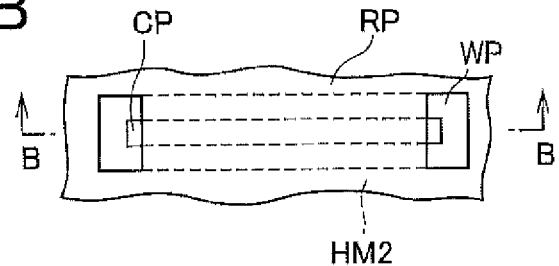
Figure 4C:
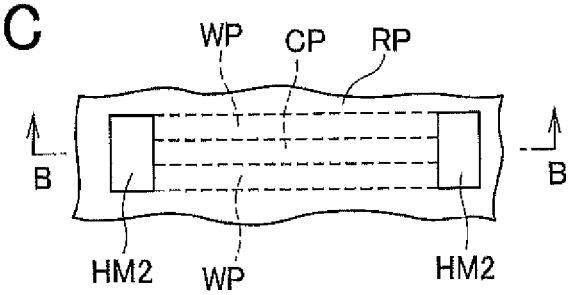
Figure 4D:
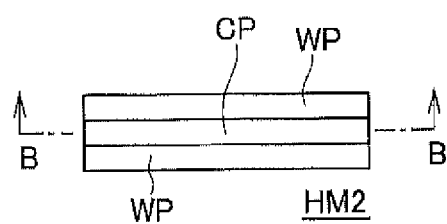
Figure 5A:
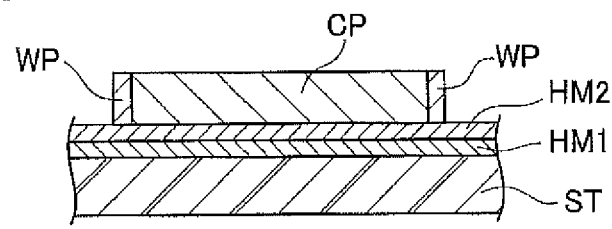
FIGS. 5A to 5D are a flow chart illustrating in a cross-sectional view (sectional view taken along the B-B line) the closed loop removal step shown in FIGS. 4A to 4D.
Figure 5B:
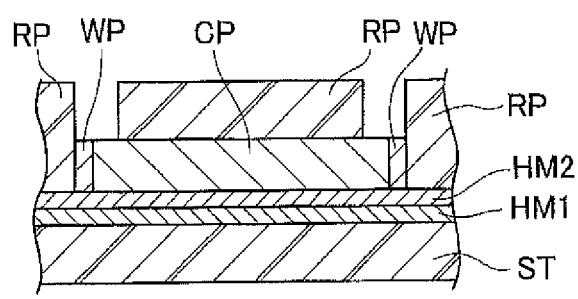
Figure 5C:
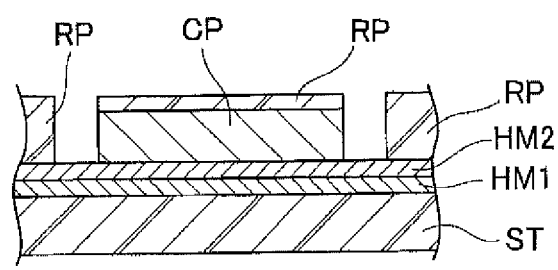
Figure 5D:
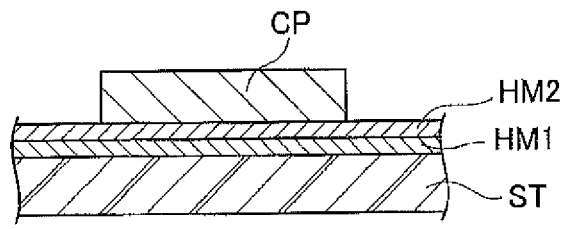

A conventional well-known method can be used for removing the closed loop structure in the closed loop removal step. For example, where the closed loop removal step is performed after the sidewall pattern formation step (FIG. 2D), initially, a resist pattern RP is formed (FIG. 4B, FIG. 5B) to cover the portions except for both longitudinal end portions of the core material CP and the sidewall pattern WP of the closed loop structure shown in FIG. 4A and FIG. 5A. Then the sidewall pattern WP and the core material CP exposed from the openings of the resist pattern RP are removed by dry etching using the resist pattern RP as a mask (FIG. 4C, FIG. 5C). The sidewall pattern WP from which the closed loop structure has been removed can be then formed by removing the remaining resist pattern RP (FIG. 4D, FIG. 5D).

In the method for producing an imprint mold according to the above-described first embodiment, as a result of forming a two-layer hard mask including the first hard mask layer HM1 and the second hard mask layer HM2 on the imprint mold base material ST, it is possible to use the second hard mask pattern HP2 in which the second hard mask layer HM2 has been patterned by the sidewall pattern WP as an etching mask when forming the first hard mask pattern HP1 for forming the small pattern 11 by etching the imprint mold base material ST. As a result, although a wet process is implemented after the second hard mask pattern HP2 has been formed and before the first hard mask pattern HP1 is formed (FIGS. 2F to 2H), the exposure to the developing liquid and rinsing liquid occurring in the wet process is unlikely to cause the peeling of the second hard mask pattern HP2 resulting from an extremely small thickness of the second hard mask pattern HP2.

Therefore, with the method for producing an imprint mold according to the first embodiment, it is possible to produce at a high yield the imprint mold 1 in which the small pattern 11 of a size less than the resolution limit in electron beam lithography and the large pattern 12 of a size enabling the formation by the electron beam lithography are formed in the same pattern formation surface (same surface).

Second Embodiment

A method for producing an imprint mold according to the second embodiment of the present disclosure will be explained hereinbelow. In the second embodiment, the components same as those of the first embodiment are assigned with the same reference numerals and the detailed explanation thereof is herein omitted.

Figure 6A:
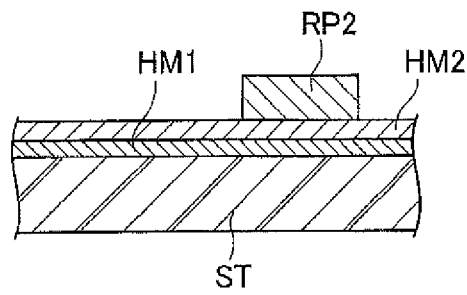
FIGS. 6A to 6H are a flow chart illustrating in a cross-sectional view the steps of the method for producing an imprint mold in the second embodiment of the present disclosure.

In the method for producing an imprint mold according to the second embodiment of the present disclosure, initially, as shown in FIGS. 6A to 6H, the imprint mold base material ST is prepared in which the first hard mask layer HM1 and the second hard mask layer HM2 are laminated in the order of description, and the second resist pattern RP2 is formed on the second hard mask layer HM2 positioned in the upper layer of the second pattern region (region where the large pattern 12 is to be formed) PA2 where the large pattern 12 is to be formed in the imprint mold 1 (second resist pattern formation step, FIG. 6A). The second resist pattern RP2 is to be used as an etching mask when forming the second hard mask pattern HP2 by etching. Therefore, the thickness of the second resist pattern RP2 (thickness of the resist film for forming the second resist pattern RP2) can be set, as appropriate, with consideration for the etching selection ratio of the resist material constituting the second resist pattern RP2 and the material constituting the second hard mask layer HM2.

In the second embodiment, the configuration in which the first hard mask layer HM1 and the second hard mask layer HM2 are each laminated over the entire surface of the imprint mold base material ST (entire surface of the pattern formation surface PS) is explained by way of example, but such a configuration is not limiting, and the second hard mask layer HM2 may be provided at least in the upper layer of the second pattern region PA2 of the imprint mold base material ST. For example, as shown in FIG. 7A, an imprint mold may be also produced using an imprint mold base material ST' in which only the first hard mask layer HM1 is provided in the upper layer of the first pattern region PA1, and the first hard mask layer HM1 and the second hard mask layer HM2 are laminated in the order of description in the upper layer of the second pattern region PA2. In the second hard mask pattern formation step (see FIG. 6B), a portion of the second hard mask layer HM2 positioned in the upper layer of the first pattern region PA1 is removed by etching and the first hard mask layer HM1 is exposed. In this case, a certain amount of damage (etching damage) can occur in the surface of the exposed first hard mask layer HM1. However, the imprint mold base material ST' provided with the second hard mask layer HM2 only in the necessary portion (portion where the second hard mask pattern HP2 is to be formed) is used, as mentioned hereinabove, a resist pattern RP' is formed also on the exposed first hard mask layer HM1, as shown in FIG. 7B, and then the second hard mask pattern HP2 is formed thereupon by etching the second hard mask layer HM2 (see FIG. 7C). As a result, the occurrence of damage caused by etching of the second hard mask layer HM2 in the first hard mask layer HM1 located on the first pattern region PA1 can be inhibited.

Figure 6E:
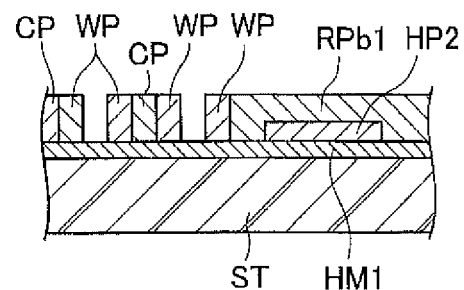
Figure 6B:
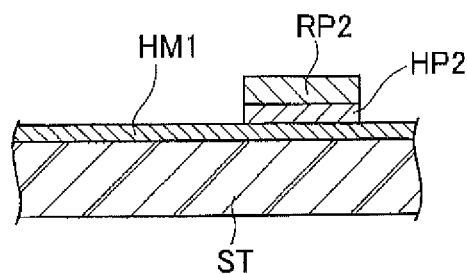
Figure 7A:
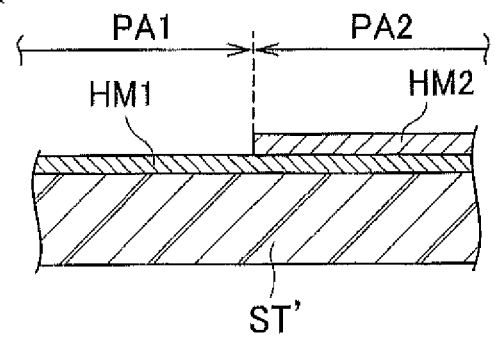
FIGS. 7A to 7C are a partial sectional view illustrating another example of the base material for an imprint mold to be used in the second embodiment of the present disclosure.
Figure 7B:
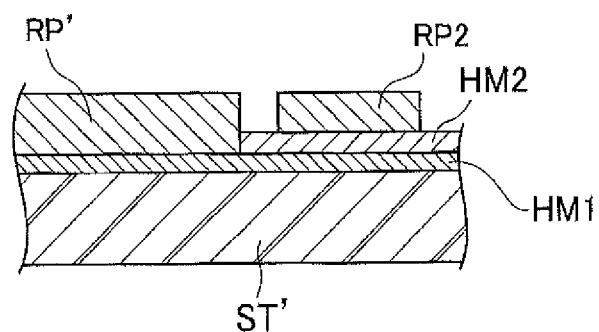
Figure 7C:
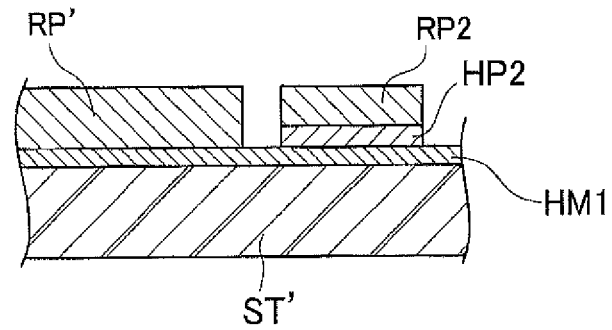

Then the second hard mask layer HM2 is etched by a dry etching method by using the second resist pattern RP2 as a mask, and the second hard mask pattern HP2 is formed (second hard mask pattern formation step, FIG. 6B).

Then, a first resist pattern RPs1 is formed on the first hard mask layer HM1 positioned in the upper layer of the first pattern region (region where the small pattern 11 is to be formed) PA1 in the imprint mold 1. In this case, a first resist pattern RPb1 is also formed such as to cover the second hard mask pattern HP2 (first resist pattern formation step, FIG. 6C). The first resist pattern RPs1 can be formed by the similar method as the first resist pattern RP1 (see FIG. 2A) in the first embodiment.

Since the first resist pattern RPs1 fulfills a role as the core material CP for forming the sidewall pattern WP in the below-described sidewall pattern formation step (FIG. 6E), the first resist pattern can be formed to a size corresponding to the size of the small pattern 11 in the imprint mold 1. As a result of thus forming the first resist pattern RPs1 to a size (substantially same as that of the core material CP) corresponding to the size of the small pattern 11 in the imprint mold 1, it is possible to omit the core material formation step (the step for slimming the first resist pattern RP1, see FIG. 2B) in the above-described first embodiment.

Then, the sidewall material film WM constituting the sidewall pattern WP is formed on the core material CP and the first resist pattern RPb1 and also on the exposed first hard mask layer HM1 (sidewall material film formation step, FIG. 6D), etch-back is performed by anisotropic etching such as RIE (Reactive Ion Etching), and the sidewall pattern WP is formed on the side wall of the core material CP and the side wall of the first resist pattern RPb1 on the first pattern region PA1 side (sidewall pattern formation step, FIG. 6E).

Figure 6F:
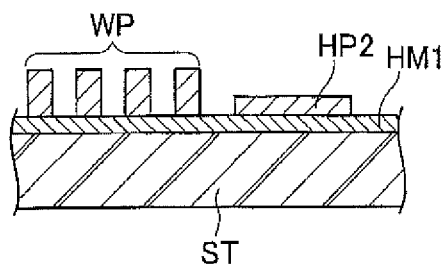
Figure 6C:
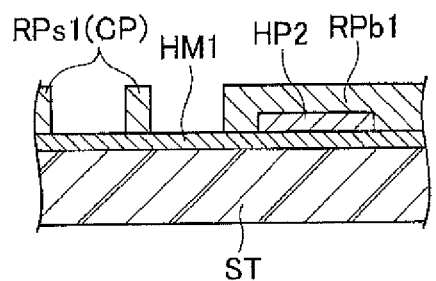

The core material CP and the first resist pattern RPb1 are then removed by asking (core material removal step, FIG. 6F). The first hard mask layer HM1 is then etched by a dry etching method by using the sidewall pattern WP and the second hard mask pattern HP2 as a mask, and the first hard mask pattern HP1 is formed (first hard mask pattern formation step, FIG. 6G).

Figure 6G:
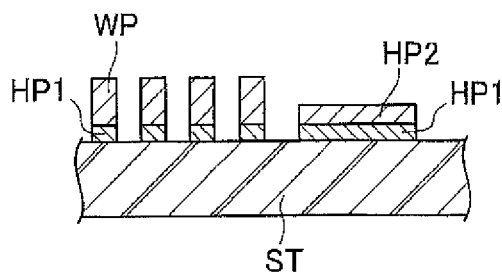
Figure 6D:
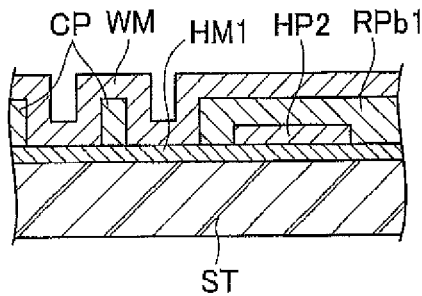
Figure 6H:
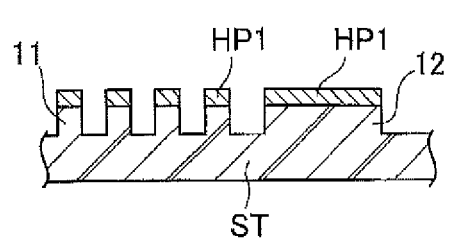

The imprint mold base material ST is then etched using the first hard mask pattern HP1 formed in the above-described manner as a mask, and the small pattern 11 and the large pattern 12 are simultaneously formed in the first pattern region PA1 and the second pattern region PA2, respectively, in the pattern formation surface PS of the imprint mold base material ST (fine uneven pattern formation step, FIG. 6H).

Finally, the first hard mask pattern HP1 is peeled off thereby producing the imprint mold 1 (see FIG. 1) in which the fine uneven pattern (main pattern) 11 for producing, for example, the wiring pattern of a semiconductor device and the fine uneven pattern (dummy pattern, alignment mark, etc.) 12 which is larger in size than the fine uneven pattern (main pattern) 11 are formed in the first pattern region PA1 and the second pattern region PA2, respectively, in the pattern formation surface PS.

Since the sidewall pattern WP formed in the abovementioned sidewall pattern formation step (FIG. 6E) is formed along the side wall of the core material CP, the sidewall pattern has the so-called closed loop structure, as shown in FIGS. 3A and 3B. Therefore, where the production steps are implemented up to the fine uneven pattern formation step (FIG. 6H) in a state in which the closed loop structure of the sidewall pattern WP is maintained, the small pattern 11 formed in the produced imprint mold 1 also has the closed loop structure.

Therefore, it is preferred that the method for producing an imprint mold according to the second embodiment further include a closed loop removal step for removing the closed loop structure, in the same manner as in the first embodiment. As a result, it is possible to form the small pattern 11 having no closed loop structure.

The closed loop removal step can be implemented after any of the sidewall pattern formation step (FIG. 6E), core material removal step (FIG. 6F), and first hard mask pattern formation step (FIG. 6G).

In the method for producing an imprint mold according to the above-described second embodiment, the imprint mold can be produced in a manner such that the wet process in the series of the production steps is ended before the sidewall pattern WP is formed, and the fine uneven pattern formation step (FIG. 6H) can be implemented, without the wet process, after the sidewall pattern WP has been formed. Therefore, the sidewall pattern WP is prevented from tilting or peeling in the wet process in the series of steps for producing the imprint mold.

As a result, with the method for producing an imprint mold according to the second embodiment, it is possible to produce at a high yield the imprint mold 1 in which the small pattern 11 of a size less than the resolution limit in electron beam lithography and the large pattern 12 of a size enabling the formation by the electron beam lithography are formed in the same pattern formation surface (same surface).

Third Embodiment

A method for producing an imprint mold according to the third embodiment of the present disclosure will be explained hereinbelow. The method for producing an imprint mold according to the third embodiment is a variation example of the second embodiment. Thus, in this production method some of the steps of the method for producing an imprint mold according to the second embodiment are different. Therefore, the different steps of the third embodiment will be explained below with reference to the flowchart shown in FIGS. 8A to 8C, while referring to the flowchart (FIGS. 6A to 6H) showing the steps of the production method according to the second embodiment. In the third embodiment, the components same as those of the second embodiment are assigned with the same reference numerals and the detailed explanation thereof is herein omitted.

In the third embodiment, in the same manner as in the second embodiment, the imprint mold base material ST is prepared in which the first hard mask layer HM1 and the second hard mask layer HM2 are laminated in the order of description, the second resist pattern RP2 is formed on the second hard mask layer HM2 (second resist pattern formation step, see FIG. 6A), and then the second hard mask layer HM2 is etched, and the second hard mask pattern HP2 is formed (second hard mask pattern formation step, see FIG. 6B).

Further, as will be described hereinbelow, in the sidewall pattern formation step (see FIG. 8C), the sidewall pattern WP is formed not only on the side wall of the first resist pattern RPs1, but also on the side wall of the second hard mask pattern HP2, and the second hard mask pattern HP2 and the sidewall pattern WP formed on the side wall thereof fulfill a role as an etching mask when the first hard mask layer HM1 is etched. Therefore, in the third embodiment, it is desirable that the size of the second hard mask pattern HP2 be set, as appropriate, with consideration for the size of the large pattern 12 in the imprint mold 1 and the thickness of the sidewall material film WM in the sidewall material film formation step (see FIG. 8B) (the thickness of the sidewall pattern WP formed on the side wall of the second hard mask pattern HP2 (length in the in-plane direction of the imprint mold base material ST)).

In the below-described sidewall pattern formation step (see FIG. 8C), the sidewall pattern WP is formed by etching the sidewall material film WM, but in this case, a certain etching damage can occur also in the second hard mask pattern HP2. Therefore, it is desirable that the thickness of the second hard mask layer HM2 laminated on the imprint mold base material ST be set with consideration for the damage occurring in the second hard mask pattern HP2 due to the etch-back and be larger than the limit thickness at which the damaged second hard mask pattern HP2 can still serve as the etching mask when the first hard mask layer is etched, that is, larger than the thickness of the second hard mask layer HM2 in the second embodiment.

Figure 8A:
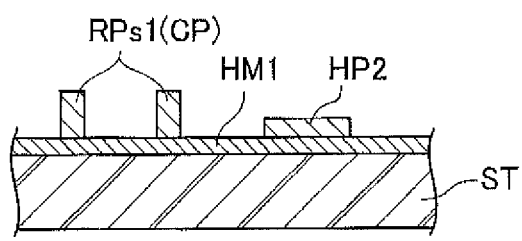
FIGS. 8A to 8C are a flowchart illustrating in a cross-sectional view some steps of the method for producing an imprint mold in the third embodiment of the present disclosure.

Then, as shown in FIG. 8A, the first resist pattern RPs1 (core material CP) is formed on the exposed first hard mask layer HM1, and the first resist pattern RPb1 such as in the second embodiment is not formed on the second hard mask pattern HP2 (first resist pattern formation step).

Figure 8B:
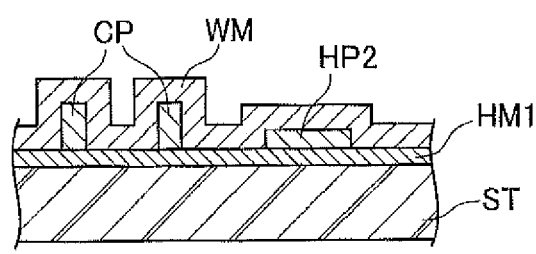
Figure 8C:
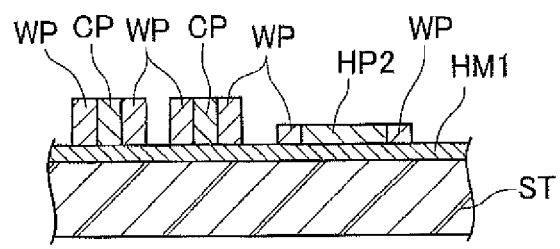

Then, as shown in FIG. 8B, the sidewall material film WM constituting the sidewall pattern WP is formed on the core material CP and the second hard mask pattern HP2 and also on the exposed first hard mask layer HM1 (sidewall material film formation step), and, as shown in FIG. 8C, etch-back is performed by anisotropic etching such as RIE (Reactive Ion Etching), and the sidewall pattern WP is formed on the side wall of the core material CP and the side wall of the second hard mask pattern HP2 (sidewall pattern formation step).

The core material CP is then removed by etching (core material removal step, FIG. 6F). The first hard mask layer HM1 is then etched by a dry etching method by using the sidewall pattern WP formed on the side wall of the core material CP and the second hard mask pattern HP2 where the sidewall pattern WP has been formed as a mask, and the first hard mask pattern HP1 is formed (first hard mask pattern formation step, FIG. 6G).

The imprint mold base material ST is then etched using the first hard mask pattern HP1 formed in the above-described manner as a mask, and the small pattern 11 and the large pattern 12 are simultaneously formed in the first pattern region PA1 and the second pattern region PA2, respectively, in the pattern formation surface PS of the imprint mold base material ST (fine uneven pattern formation step, FIG. 6H).

Finally, the first hard mask pattern HP1 is peeled off thereby making it possible to produce the imprint mold 1 (see FIG. 1) in which the fine uneven pattern (main pattern) 11 for producing, for example, the wiring pattern of a semiconductor device and the fine uneven pattern (dummy pattern, alignment mark, etc.) 12 which is larger in size than the fine uneven pattern (main pattern) 11 are formed in the first pattern region PA1 and the second pattern region PA2, respectively, in the pattern formation surface PS.

Since the sidewall pattern WP formed in the abovementioned sidewall pattern formation step (FIG. 8C) is formed along the side wall of the core material CP (second hard mask pattern HP2), the sidewall pattern has the so-called closed loop structure, as shown in FIGS. 3A and 3B. Therefore, where the production steps are implemented up to the fine uneven pattern formation step (FIG. 6H) in a state in which the closed loop structure of the sidewall pattern WP is maintained, the small pattern 11 formed in the produced imprint mold 1 also has the closed loop structure.

Therefore, it is preferred that the method for producing an imprint mold according to the third embodiment further include a closed loop removal step for removing the closed loop structure, in the same manner as in the first and second embodiments. As a result, it is possible to form the small pattern 11 having no closed loop structure. The sidewall pattern WP formed along the side wall of the second hard mask pattern HP2 likewise has a closed loop structure, but where the size of the second hard mask pattern HP2 is set with consideration for the formation of the sidewall pattern WP, it is not necessary to remove the closed loop structure of the sidewall pattern WP formed in the side wall of the second hard mask pattern HP2.

The closed loop removal step can be implemented after any of the sidewall pattern formation step (FIG. 8C), core material removal step (see FIG. 6F), and first hard mask pattern formation step (see FIG. 6G).

In the method for producing an imprint mold according to the above-described third embodiment, the imprint mold can be produced in a manner such that the wet process in the series of the production steps is ended before the sidewall pattern WP is formed, and the fine uneven pattern formation step (see FIG. 6H) can be implemented, without the wet process, after the sidewall pattern WP has been formed, in the same manner as in the second embodiment. Therefore, the sidewall pattern WP is prevented from tilting or peeling in the wet process in the series of steps for producing the imprint mold.

As a result, with the method for producing an imprint mold according to the third embodiment, it is possible to produce at a high yield the imprint mold 1 in which the small pattern 11 of a size less than the resolution limit in electron beam lithography and the large pattern 12 of a size enabling the formation by the electron beam lithography are formed in the same pattern formation surface (same surface).

The embodiments explained hereinabove are described to facilitate the understanding of the present disclosure and are not intended to restrict the present disclosure. Therefore, the elements disclosed in the embodiments also include all of the design changes and equivalents belonging to the technical scope of the present disclosure.

In the closed loop removal step in the first to third embodiments, the closed loop structure is removed by etching both longitudinal end portions of the sidewall pattern WP having the closed loop structure, but such a feature is not limiting. For example, the closed loop structure may be removed by etching only one end portion, and the sidewall pattern WP of a horizontal U-like shape in the planar view or a vertical U-like shape in the planar view may be formed. Further, the closed loop structure is obviously not needed to be removed when the small pattern 11 of the imprint mold 1 is a closed loop structure.

In the first to third embodiments, the core material CP is constituted by a resist material such as an electron beam-sensitive resist material, but such a feature is not limiting, and a material (for example, polysilicon, an oxide film, a nitride film, a carbon-containing film, or a metal film) other than a resist material may be also used as long as the material can be selectively removed by etching or the like.

INDUSTRIAL APPLICABILITY

The methods of the present disclosure may be used for producing an imprint mold to be used in a nanoimprint step for forming a fine uneven pattern, for example, in a semiconductor substrate in the semiconductor device fabrication process.

EXPLANATION OF REFERENCE NUMERALS

1 . . . imprint mold
11 . . . fine uneven pattern (small pattern, first fine pattern)
12 . . . fine uneven pattern (large pattern, second fine pattern)
ST . . . imprint mold base material (base material)
HM1 . . . first hard mask layer
HM2 . . . second hard mask layer
HP1 . . . first hard mask pattern
HP2 . . . second hard mask pattern
RP1, RPs1, RPb1 . . . first resist pattern
RP2 . . . second resist pattern
PA1 . . . first pattern region
PA2 . . . second pattern region

The invention claimed is:

1. A method for producing a nanoimprint mold in which a first pattern and a second pattern which is larger in size than the first pattern are formed on the same surface, the method comprising:
preparing a base material on which a first hard mask layer and a second hard mask layer are laminated in the order of description, and forming a first resist pattern on the second hard mask layer positioned on an upper layer of a first pattern region where the first pattern is to be formed in the base material;
forming a sidewall pattern on a side wall of the first resist pattern;
etching the second hard mask layer by using the sidewall pattern as a mask, and forming a second hard mask pattern;
after etching the second hard mask layer, forming a second resist pattern on the first hard mask layer positioned on an upper layer of a second pattern region where the second pattern is to be formed in the base material;
etching the first hard mask layer by using the second hard mask pattern and the second resist pattern as a mask, and forming a first hard mask pattern; and
etching the base material by using the first hard mask pattern as a mask, and forming the first pattern and the second pattern.

2. A method for producing a nanoimprint mold in which a first pattern and a second pattern which is larger in size than the first pattern are formed on the same surface, the method comprising:
preparing a base material on which a first hard mask layer and a second hard mask layer are laminated in the order of description, and forming a second resist pattern on the second hard mask layer positioned on an upper layer of a second pattern region where the second pattern is to be formed in the base material;
etching the second hard mask layer by using the second resist pattern as a mask, and forming a second hard mask pattern;
forming a first resist pattern on the second hard mask pattern and on the first hard mask layer positioned on an upper layer of a first pattern region where the first pattern is to be formed in the base material;
forming a sidewall pattern on a side wall of the first resist pattern;
etching the first hard mask layer by using the sidewall pattern and the second hard mask pattern as a mask, and forming a first hard mask pattern; and
etching the base material by using the first hard mask pattern as a mask, and forming the first pattern and the second pattern.

3. A method for producing a nanoimprint mold in which a first pattern and a second pattern which is larger in size than the first pattern are formed on the same surface, the method comprising:
preparing a base material on which a first hard mask layer and a second hard mask layer are laminated in the order of description, and forming a second resist pattern on the second hard mask layer positioned on an upper layer, of a second pattern region where the second pattern is to be formed in the base material;
etching the second hard mask layer by using the second resist pattern as a mask, and forming a second hard mask pattern;
forming a first resist pattern on the first hard mask layer positioned on an upper layer of a first pattern region where the first pattern is to be formed in the base material, and not forming the first resist pattern on the second hard mask pattern;
forming a sidewall pattern on a side wall of the first resist pattern and in a side wall of the second hard mask pattern;
etching the first hard mask layer by using the sidewall pattern and the second hard mask pattern as a mask, and forming a first hard mask pattern; and
etching the base material by using the first hard mask pattern as a mask, and forming the first pattern and the second pattern.

4. The method for producing a nanoimprint mold according to claim 1, wherein
the first hard mask layer is constituted by a metal material, and the second hard mask layer is constituted by silicon, silicon oxide, nitride, or oxynitride.

5. The method for producing a nanoimprint mold according to claim 2, wherein
the first hard mask layer is constituted by a metal material, and
the second hard mask layer is constituted by silicon, silicon oxide, nitride, or oxynitride.

6. The method for producing a nanoimprint mold according to claim 3, wherein
the first hard mask layer is constituted by a metal material, and
the second hard mask layer is constituted by silicon, silicon oxide, nitride, or oxynitride.

7. The method for producing a nanoimprint mold according to claim 1, wherein
the base material is transparent.

8. The method for producing a nanoimprint mold according to claim 2, wherein
the base material is transparent.

9. The method for producing a nanoimprint mold according to claim 3, wherein
the base material is transparent.

10. The method for producing a nanoimprint mold according to claim 1, wherein
the size of the first pattern is in a range of from about 5 nm to 30 nm, and
the size of the second pattern is in a range of from about 50 nm to 300 nm.

11. The method for producing a nanoimprint mold according to claim 2, wherein
the size of the first pattern is in a range of from about 5 nm to 30 nm, and
the size of the second pattern is in a range of from about 50 nm to 300 nm.

12. The method for producing a nanoimprint mold according to claim 3, wherein
the size of the first pattern is in a range of from about 5 nm to 30 nm, and
the size of the second pattern is in a range of from about 50 nm to 300 nm.

13. The method for producing a nanoimprint mold according to claim 1, wherein
the first resist pattern and the second resist pattern are formed by either electron beam drawing or imprint processing.

14. The method for producing a nanoimprint mold according to claim 2, wherein
the first resist pattern and the second resist pattern are formed by either electron beam drawing or imprint processing.

15. The method for producing a nanoimprint mold according to claim 3, wherein
the first resist pattern and the second resist pattern are formed by either electron beam drawing or imprint processing.

16. The method for producing a nanoimprint mold according to claim 1, wherein
the sidewall pattern is formed by atomic layer deposition method.

17. The method for producing a nanoimprint mold according to claim 2, wherein
the sidewall pattern is formed by atomic layer deposition method.

18. The method for producing a nanoimprint mold according to claim 3, wherein
the sidewall pattern is formed by atomic layer deposition method.

19. The method for producing a nanoimprint mold according to claim 1, wherein the first pattern is of a line-and-space shape.

20. The method for producing a nanoimprint mold according to claim 2, the method further comprising one or more wet processes after formation of the sidewall pattern, wherein the sidewall pattern is not tilted, broken, peeled off, or deformed during the one or more wet processes.

* * * * *